(12) United States Patent
Chuang et al.

(10) Patent No.: US 9,184,331 B2
(45) Date of Patent: Nov. 10, 2015

(54) METHOD FOR REDUCING TILT OF OPTICAL UNIT DURING MANUFACTURE OF IMAGE SENSOR

(71) Applicant: KINGPAK TECHNOLOGY INC., Chu-Pei, Hsin-Chu Hsien (TW)

(72) Inventors: Chun-Hua Chuang, Hsin-Chu Hsien (TW); Chien-Wei Chang, Hsin-Chu Hsien (TW); Chen-Pin Peng, Hsin-Chu Hsien (TW); Chung-Hsien Hsin, Hsin-Chu Hsien (TW); Chun-Lung Huang, Hsin-Chu Hsien (TW); Hsiu-Wen Tu, Hsin-Chu Hsien (TW); Cheng-Chang Wu, Hsin-Chu Hsien (TW); Chung-Yu Yang, Hsin-Chu Hsien (TW); Rong-Chang Wang, Hsin-Chu Hsien (TW); Jo-Wei Yang, Hsin-Chu Hsien (TW)

(73) Assignee: Kingpak Technology Inc., Hsin-chu Hsien (TW)

( * ) Notice: Subject to any disclaimer, the term of this patent is extended or adjusted under 35 U.S.C. 154(b) by 242 days.

(21) Appl. No.: 13/766,568

(22) Filed: Feb. 13, 2013

(65) Prior Publication Data

US 2013/0149805 A1 Jun. 13, 2013

Related U.S. Application Data

(63) Continuation-in-part of application No. 13/403,159, filed on Feb. 23, 2012, now Pat. No. 8,450,137.

(60) Provisional application No. 61/446,355, filed on Feb. 24, 2011.

(51) Int. Cl.
*H01L 21/00* (2006.01)
*H01L 31/18* (2006.01)
*H01L 27/146* (2006.01)

(52) U.S. Cl.
CPC .......... *H01L 31/18* (2013.01); *H01L 27/14618* (2013.01); *H01L 27/14625* (2013.01); *H01L 27/14685* (2013.01); *H01L 2224/48091* (2013.01); *H01L 2224/48464* (2013.01); *H01L 2224/49175* (2013.01); *H01L 2924/0002* (2013.01)

(58) Field of Classification Search
USPC .......................... 438/65, 106, 118, 121, 125; 257/E21.504, E23.128, E31.117, 257/E31.127
See application file for complete search history.

(56) References Cited

U.S. PATENT DOCUMENTS

2006/0024857 A1* 2/2006 Chen et al. ...................... 438/65
2006/0273249 A1* 12/2006 Webster et al. ................ 250/239
2008/0246845 A1* 10/2008 Chan .......................... 348/207.2

* cited by examiner

*Primary Examiner* — Charles Garber
*Assistant Examiner* — Abdulfattah Mustapha
(74) *Attorney, Agent, or Firm* — Juan Carlos A. Marquez; Bacon & Thomas PLLC

(57) ABSTRACT

A method for reducing the tilt of an optical unit during manufacture of an image sensor includes the steps of: providing a semimanufacture of the image sensor, carrying out a preheating process, carrying out an adhesive application process, carrying out an optical unit mounting process, and carrying out a packaging process. Due to the preheating process, the semimanufacture will be subjected to a stabilized process environment during the adhesive application process and the optical unit mounting process, so as for the optical unit to remain highly flat once attached to the semimanufacture. The method reduces the chances of tilt and crack of the optical unit and thereby contributes to a high yield rate.

20 Claims, 16 Drawing Sheets

METHOD FOR REDUCING TILT OF OPTICAL UNIT DURING MANUFACTURE OF IMAGE SENSOR

CROSS REFERENCE TO RELATED APPLICATIONS

This application is a continuation-in-part (CIP) of U.S. patent application Ser. No. 13/403,159, filed on Feb. 23, 2012, which claims priority from the U.S. Provisional Application No. 61/446,355, filed Feb. 24, 2011, entitled "Method for Reducing Tilt of Transparent Window during Manufacturing of Image Sensor". The disclosure of the related applications is incorporated herein by reference.

BACKGROUND OF THE INVENTION

1. Technical Field

The present invention relates to a method for reducing the tilt of an optical unit during manufacturing of an image sensor, and more particularly, to a method for reducing the tilt of an optical unit during manufacturing of an image sensor that can improve the yield rate by carrying out a preheating process to stabilize the process environment.

2. Description of Related Art

FIG. 1A is a schematic view illustrating a structure of a conventional image sensor. FIG. 1B is a schematic view illustrating tilting and consequent fracture of a transparent plate during a process of manufacturing the conventional image sensor. FIG. 1C is a schematic view illustrating tilting of the transparent plate and consequent overflow of an adhesive during the process of manufacturing the conventional image sensor.

As shown in FIG. 1A, the conventional image sensor 100 substantially includes a circuit substrate 10 (e.g., a printed circuit board; PCB), an image sensor die 20, a transparent plate 30 and an encapsulant 40. The image sensor die 20 is disposed on the circuit substrate 10 and is electrically connected to circuits on the circuit substrate 10 via metal wirings 25 through wire bonding, and the transparent plate 30 is disposed above a photosensitive region (not shown) of the image sensor die 20 by means of an adhesive 26 such as an epoxy resin, and then the metal wirings 25 and side edges of the image sensing die 20 and the transparent plate 30 are encapsulated by the encapsulant 40 through molding.

However, as shown in FIG. 1B, if the adhesive 26 is applied uneven, and then the transparent plate 30 adhered above the photosensitive region (not shown) of the image sensing die 20 is placed in an out-of-level state (e.g., inclined in the lateral direction) during the molding process, the tilt of the transparent plate 30 with respect to the image sensor die 20 or the circuit substrate 10 will become overly large to decrease the sensing quality and this makes it easy to cause fracture of the transparent plate 30 when the mold 50 is pressed downwards during the molding process, which decreases the yield rate of image sensors.

Additionally, as shown in FIG. 1C, the air in a space enclosed by the transparent plate 30, the image sensor die 20 and the adhesive 26 during the molding process tends to expand non-uniformly when heated by a high environmental temperature. This will not only push the transparent plate 30 to cause tilting of the transparent plate 30 but also push the adhesive 26 outwards to cause overflow of the adhesive 26, thus degrading the yield rate of image sensors.

BRIEF SUMMARY OF THE INVENTION

The present invention is a method for reducing the tilt of an optical unit during manufacture of an image sensor. According to the method, a preheating process is carried out to release the air pressure in the vicinity of an image sensor die so that the closed space formed by mounting the optical unit will not expand due to the high temperature of subsequent processes. Additionally, the closed space formed by mounting the optical unit may be formed with a gap in communication with the outside to lower the pressure inside the closed space, thereby preventing the optical unit from being out-of-level. Now that the tilt, if any, of the optical unit is reduced, and the optical unit is kept from fracture during the optical unit mounting process, an increased yield rate is achievable.

The present invention provides a method for reducing the tilt of an optical unit during manufacturing of an image sensor, comprising the following steps: providing a semimanufacture of the image sensor, which comprises a circuit substrate and an image sensor die, wherein the circuit substrate has a supporting surface and a bottom surface, a plurality of first conductive contacts are provided on the supporting surface, and the image sensor die comprises: a first surface attached to the supporting surface; a second surface having a photosensitive region; and a plurality of second conductive contacts disposed outside the photosensitive region and electrically connected to the first conductive contacts via metal wirings respectively; carrying out a preheating process by placing the semimanufacture into an environment at a specific temperature; carrying out an adhesive application process by, after the preheating process, applying an adhesive onto the second surface around the photosensitive region without covering the photosensitive region; carrying out an optical unit closing process by, after the adhesive application process, placing an optical unit on the adhesive and curing the adhesive to fix the optical unit onto the second surface and to form an air chamber between the image sensor die and the optical unit; and carrying out a packaging process by packaging the semimanufacture and the optical unit with an encapsulant.

Through implementation of the present invention, at least the following effects can be achieved:

1. Environment factors for the semimanufacture during the adhesive application process can be made stable to reduce the tilt of the optical unit after the optical unit closing process;

2. The optical unit is prevented from tilting which may otherwise occur if the air in the air chamber formed by the optical unit mounting process expands.

3. The adhesive will not overflow after the optical unit mounting process.

4. A balance between the air pressure in and outside the air chamber formed by the optical unit mounting process can be reached.

The detailed features and advantages of the present invention will be described in detail with reference to the preferred embodiment so as to enable persons skilled in the art to gain insight into the technical disclosure of the present invention, implement the present invention accordingly, and readily understand the objectives and advantages of the present invention by perusal of the contents disclosed in the specification, the claims, and the accompanying drawings.

BRIEF DESCRIPTION OF THE SEVERAL VIEWS OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE INVENTION

Figure 1A:
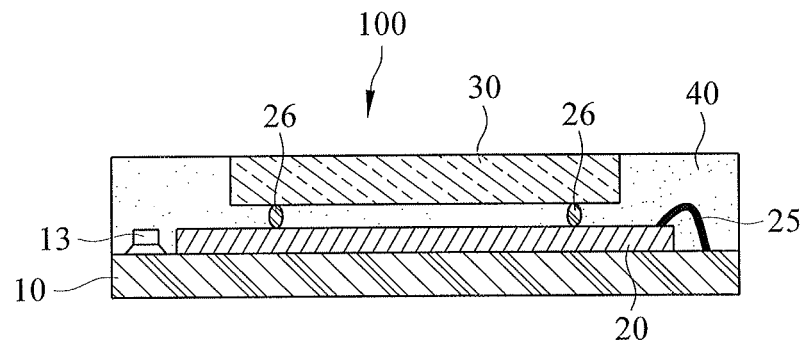
FIG. 1A is a schematic view illustrating a structure of a conventional image sensor.
Figure 1B:
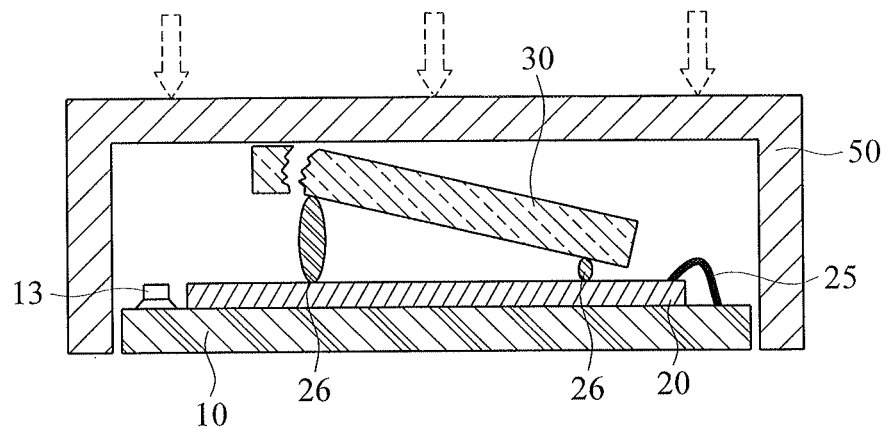
FIG. 1B is a schematic view illustrating tilting and consequent fracture of a transparent plate during a process of manufacturing the conventional image sensor.
Figure 1C:
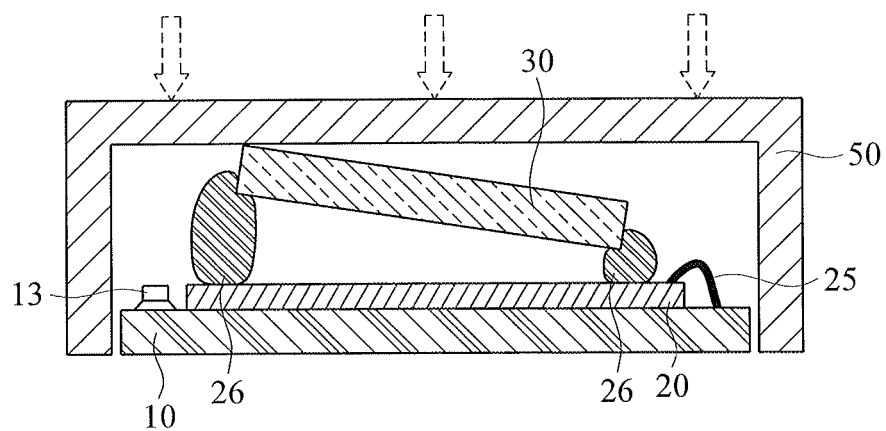
FIG. 1C is a schematic view illustrating tilting of the transparent plate and consequent overflow of an adhesive during the process of manufacturing the conventional image sensor.
Figure 2:
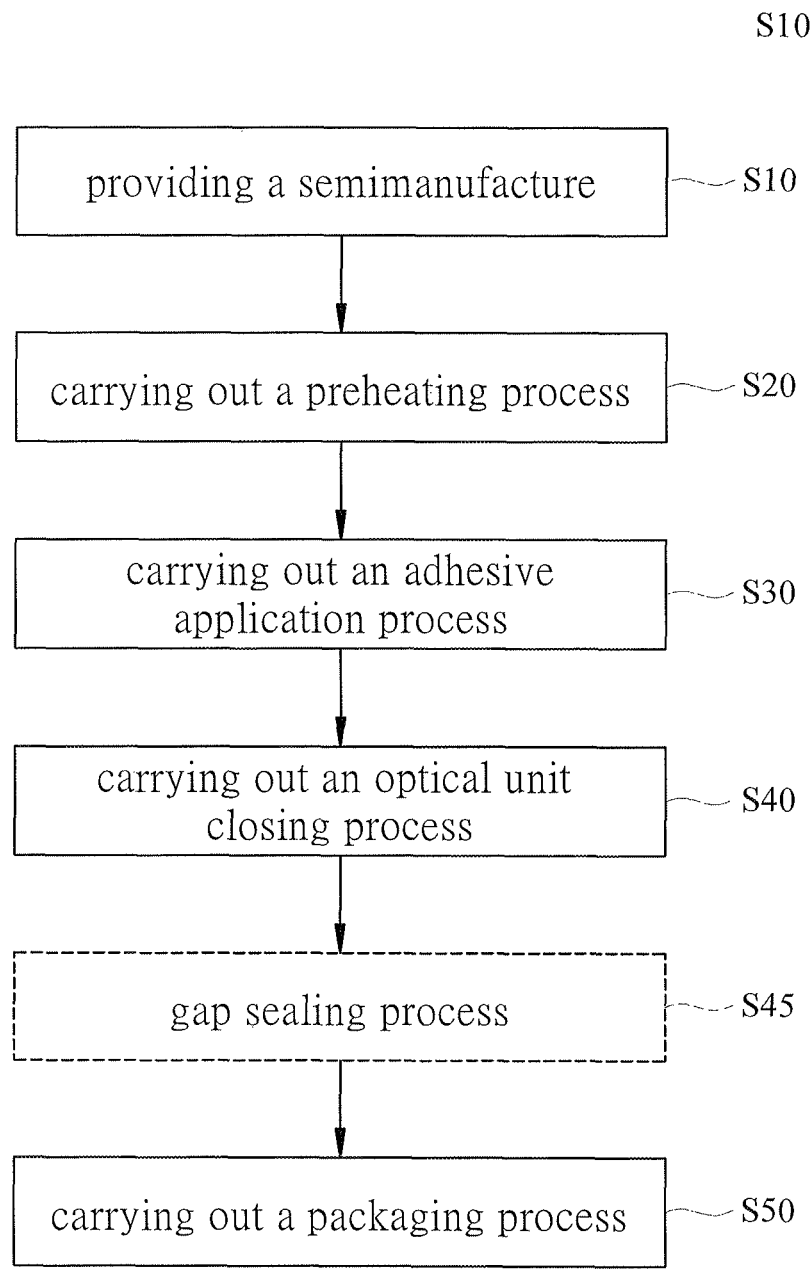
FIG. 2 is a flowchart diagram of a method for reducing the tilt of an optical unit during manufacturing of an image sensor according to an embodiment of the present invention.

As shown in FIG. 2, this embodiment is a method for reducing the tilt of an optical unit during manufacturing of an image sensor, which comprises the following steps of: providing a semimanfuacture (step S10); carrying out a preheating process (step S20); carrying out an adhesive application process (step S30); carrying out an optical unit closing process (step S40); and carrying out a packaging process (step S50).

Figure 3:
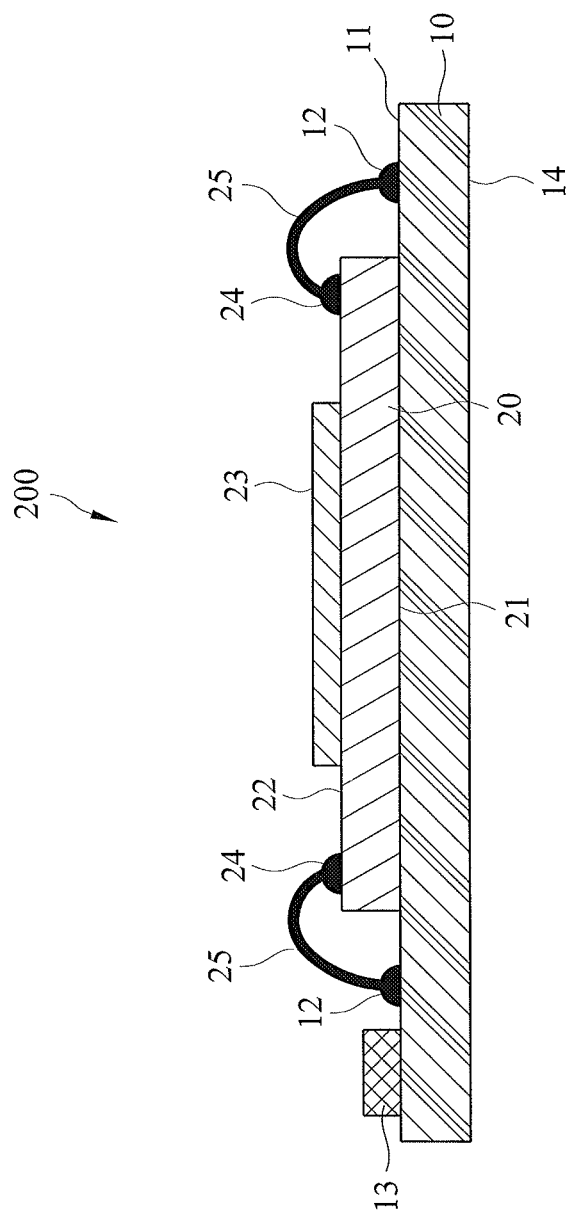
FIG. 3 is a schematic view of a semimanufacture of an image sensor according to an embodiment of the present invention.

As shown in FIG. 3, a semimanufacture is provided (step S10). The semimanufacture 200 provided in this embodiment is a semimanufacture of an image sensor, which comprises a circuit substrate 10 and an image sensor die 20.

The circuit substrate 10 has a supporting surface 11 and a bottom surface 14. A plurality of first conductive pads 12 is disposed on the supporting surface 11 for electrical connection in the wire bonding process and the plurality of first conductive pads 12 is electrically connected to circuits on the supporting surface 11. Additionally, a drive integrated circuit (IC) and passive elements 13 may also be optionally disposed on the supporting surface 11 and electrically connected to the circuits on the supporting surface 11.

The image sensor die 20 may be a complementary metal oxide semiconductor (CMOS) image sensor die or a charge coupled device (CCE), and it comprises: a first surface 21; a second surface 22; and a plurality of second conductive contacts 24.

The first surface 21 is the lower surface of the image sensor die 20, and is attached to the supporting surface 11 through use of an adhesive so that the image sensor die 20 is attached to the circuit substrate 10. The second surface 22 is the upper surface of the image sensor die 20, and has a photosensitive region 23 for receiving and sensing light rays. The second conductive contacts 24 are disposed outside the photosensitive region 23 and electrically connected to the first conductive contacts 12 on the first surface 21 by metal wirings 25 respectively. Thus, the image sensor die 20 can be electrically connected to the drive IC and the passive elements 13 through the circuits on the supporting surface 11.

A preheating process is carried out (step S20) by placing the semimanufacture 200 into an environment at a specific temperature. The environment at the specific temperature may be an oven, and the specific temperature may range between 35° C. and 45° C. By preheating the semimanufacture 200, the air temperature around the second surface 22 and the supporting surface 11 can be increased to a temperature range which is the same as the environment temperature in the subsequent adhesive application process and the subsequent optical unit closing process so as to release the air pressure in the space around the second surface 22 and the supporting surface 11. This can prevent the air around the second surface 22 and the supporting surface 11 from being influenced by the temperature rise in the subsequent adhesive application process or the subsequent optical unit closing process to cause non-uniform expansion and consequent tilting of the optical unit (not shown). This can also prevent the enclosed space formed in the optical unit closing process from expanding due to the temperature rise to cause unevenness of the optical unit, and prevent occurrence of overflow of the adhesive.

Figure 4A:
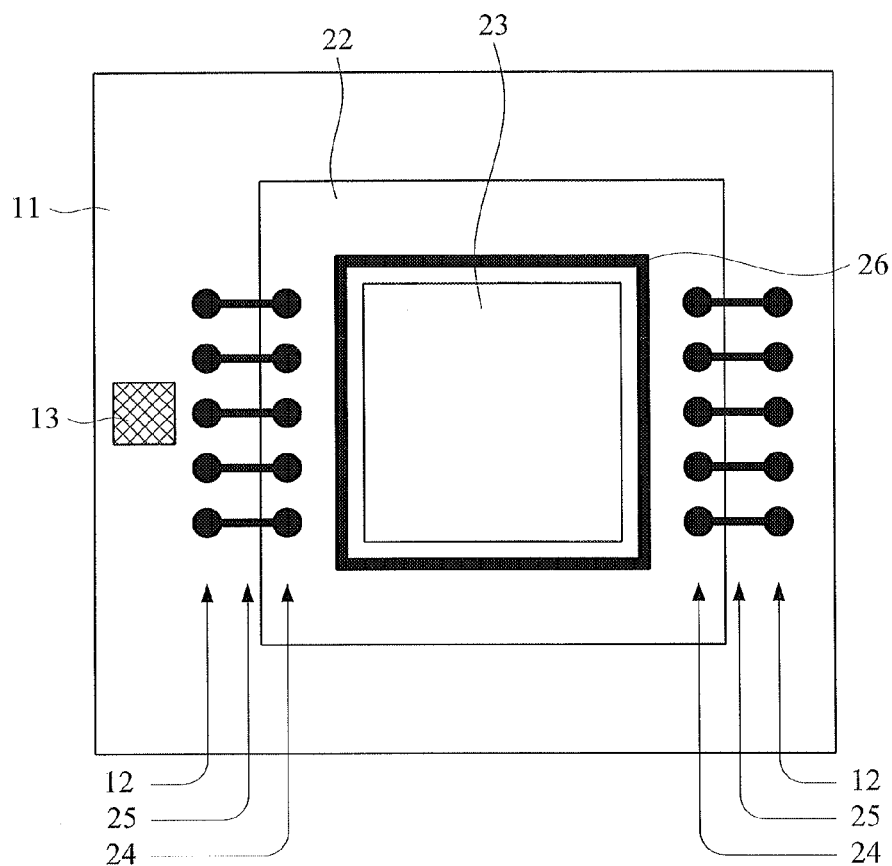
FIG. 4A is a top view of a semimanufacture of an image sensor obtained after an adhesive application process according to an embodiment of the present invention.

As shown in FIG. 4A, an adhesive application process is carried out (step S30) after the preheating process (step S20) by applying an adhesive 26 onto the second surface 22 around the photosensitive region 23 without covering the photosensitive region 23. During the adhesive application process (step S30), the environment temperature may still be maintained at the specific temperature which is the same as that of the preheating process (e.g., between 35° C. and 45° C.). The adhesive 26 may be applied in regions between the photosensitive region 23 and the second conductive contacts 24 to form a closed pattern, which looks like a frame-shaped pattern. Thereby, the photosensitive region 23 after being packaged can be accommodated in the space formed by the adhesive 26 and the transparent plate (not shown) to prevent the photosensitive region 23 from being influenced by external factors.

Figure 4B:
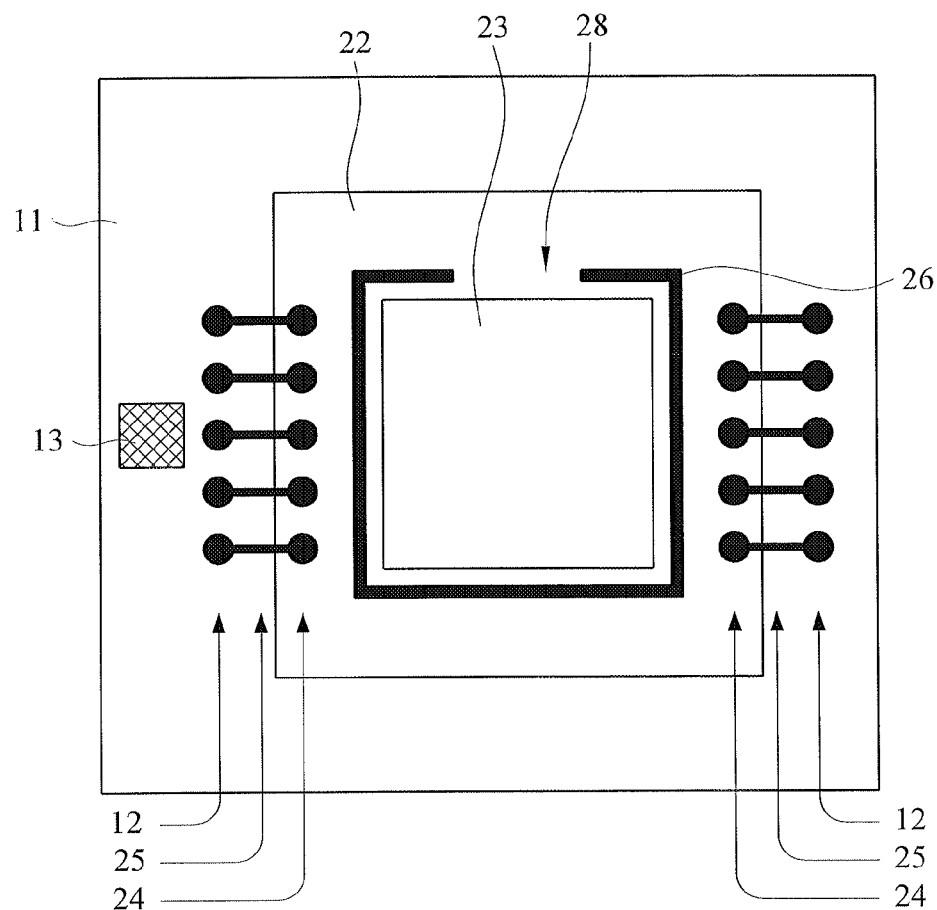
FIG. 4B is a top view of a semimanufacture of an image sensor obtained after an adhesive application process according to another embodiment of the present invention.

In addition to carrying out step S20 to prevent pressure from building up in the aforesaid closed space due to a subsequent temperature rise, a gap may be formed to bring the closed space into communication with the outside and thereby reduce the pressure in the closed space. In the adhesive application process (step S30), referring to FIG. 4B, the adhesive 26 may be applied to an area between the photosensitive region 23 and the second conductive contacts 24 in such a way that the adhesive 26 not only does not cover the photosensitive region 23, but also forms a generally C-shaped pattern. Thus, the adhesive 26 has a gap 28 at the opening of the generally C-shaped pattern. This allows the air in the space enclosed by the adhesive 26, the optical unit (not shown), and the image sensor die 20 to communicate with the air outside the gap 28, thereby balancing the pressure inside and outside the gap 28.

Figure 4C:
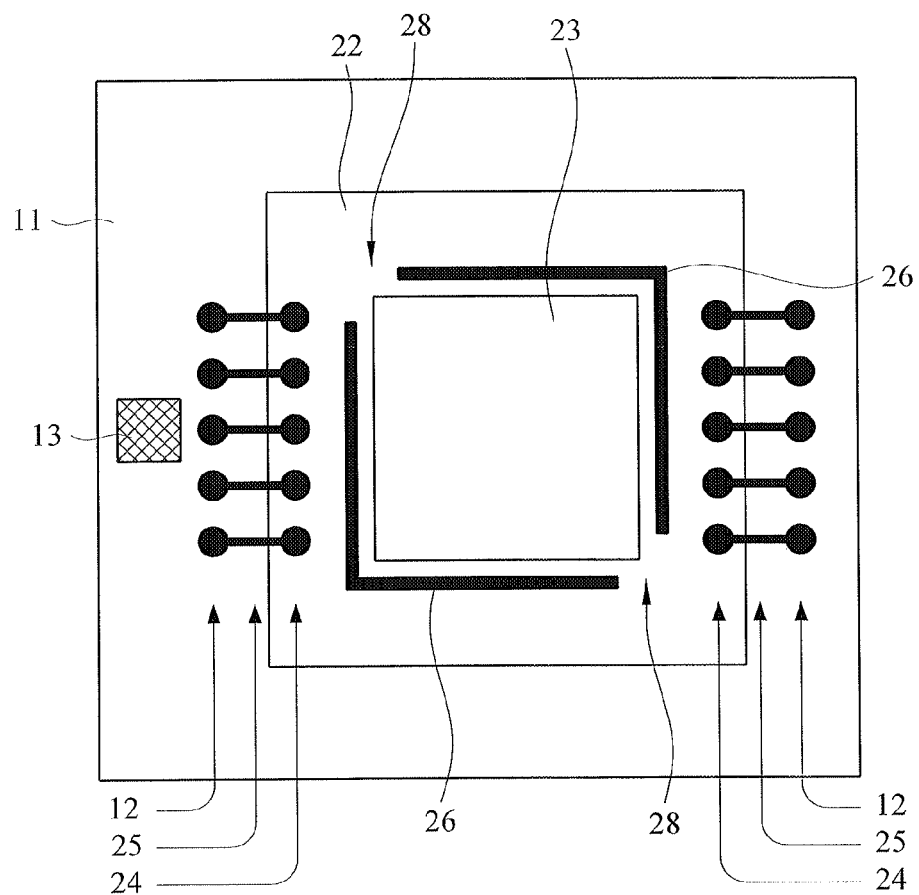
FIG. 4C is a top view of a semimanufacture of an image sensor obtained after an adhesive application process according to yet another embodiment of the present invention.

As shown in FIG. 4C, the adhesive application process (step S30) may also be carried out in such a manner that the adhesive 26 is applied to an area between the photosensitive region 23 and the second conductive contacts 24 and forms two L-shaped patterns that face each other. Thus, a hollow square pattern with a gap 28 in each of two opposite corners is formed. The two gaps 28 are located in two opposite right-angled corners of the hollow square pattern respectively such that the air in the space enclosed by the adhesive 26, the optical unit (not shown), and the image sensor die 20 can communicate with the air outside the gaps 28 to achieve a balance between the pressure inside and outside the gaps 28, thereby preventing unevenness of the optical unit and overflow of the adhesive, both of which may otherwise result from a pressure rise in the closed space formed by the optical unit mounting process (step S40).

Figure 4D:
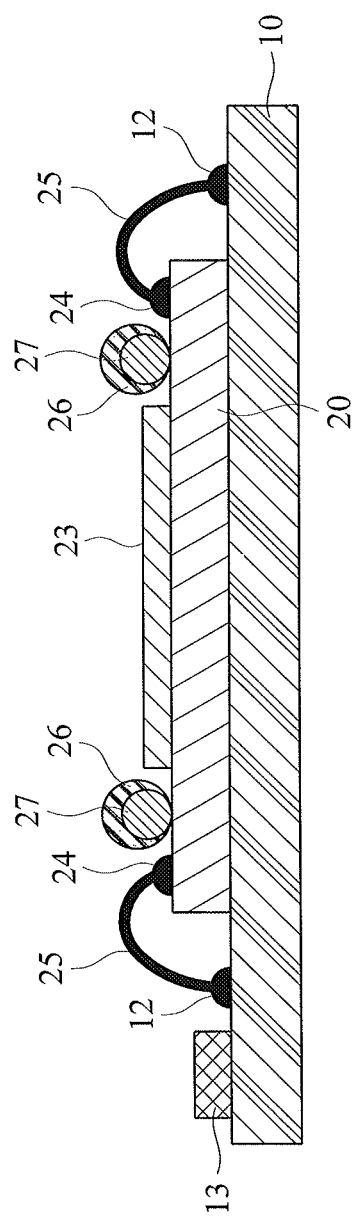
FIG. 4D is a schematic view of a semimanufacture of an image sensor obtained after an adhesive application process according to an embodiment of the present invention.

As shown in FIG. 4D, a plurality of ball spacers 27 may be further added into the adhesive 26 to keep a most appropriate distance between the optical unit (e.g., transparent plate 30) and the image sensing die 20 so that the tilt of the optical unit is controlled to be within a reasonable range.

Figure 5:
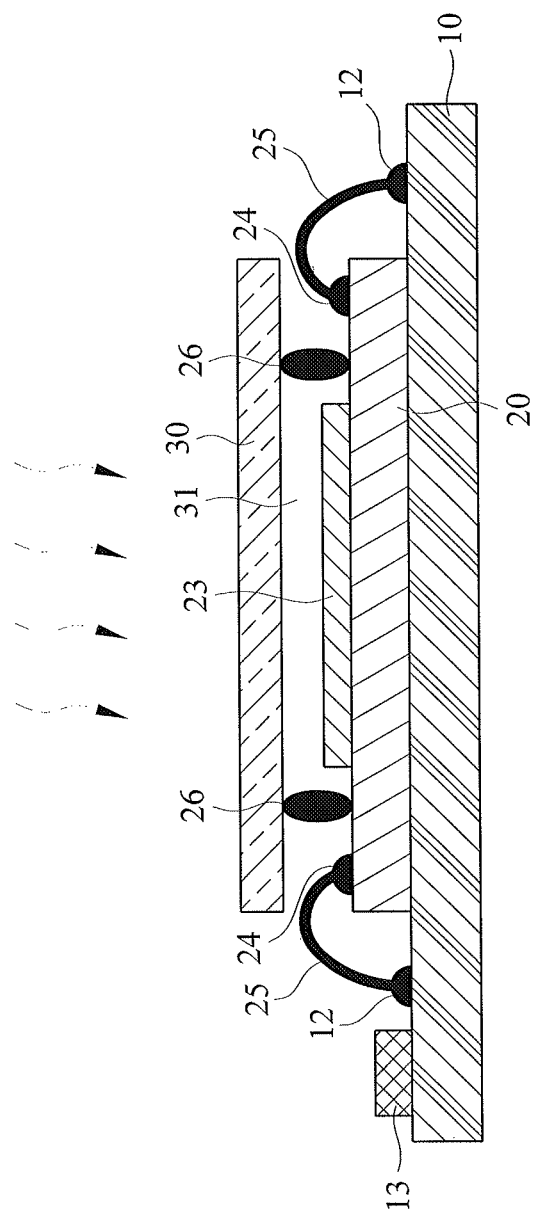
FIG. 5 is a schematic view of a semimanufacture of an image sensor obtained after an optical unit mounting process according to an embodiment of the present invention.

Then as shown in FIG. 5, an optical unit closing process (step S40) is carried out. The optical unit can be a transparent plate 30 made of glass. The optical unit closing process is carried out after the adhesive application process (step S30) by placing the optical unit (e.g., transparent plate 30) on the adhesive 26 and curing the adhesive 26 to fix the optical unit onto the second surface 22 and to form an air chamber 31 between the image sensor die 20 and the optical unit. During the optical unit closing process (step S40), the environment temperature may also be maintained at the specific temperature which is the same as that of the preheating process (e.g., between 35° C. and 45° C.).

The adhesive 26 may be a photocurable adhesive, and particularly an ultraviolet (UV) curable adhesive; and in the optical unit closing process (step S40), the UV curable adhesive is cured through irradiation of UV light rays.

As shown in FIG. 4D through FIG. 6B, in cases where no ball spacers 27 are added into the adhesive 26, the optical unit may include an intermediate layer 32 in addition to the transparent plate 30 in order to keep the transparent plate 30 properly spaced from the image sensor die 20 and thereby control the tilt of the transparent plate 30 within a reasonable range. The intermediate layer 32 has a fixed height and serves to control the spacing between the transparent plate 30 and the image sensor die 20.

The intermediate layer 32 is a hollow square structure and therefore will not cover the photosensitive region 23 when aligned with and adhesively attached to the adhesive 26 in the optical unit mounting process (step S40). Furthermore, a frame-shaped groove 33 may be formed on the inner side of an upper surface 35 of the intermediate layer 32 so that the transparent plate 30 can be adhesively attached to the frame-shaped groove 33. The intermediate layer 32 may be made of glass, ceramic, a liquid crystal polymer, a molding compound, a siloxane-based polymer, a photosensitive dry film, or a solder mask.

Figure 6A:
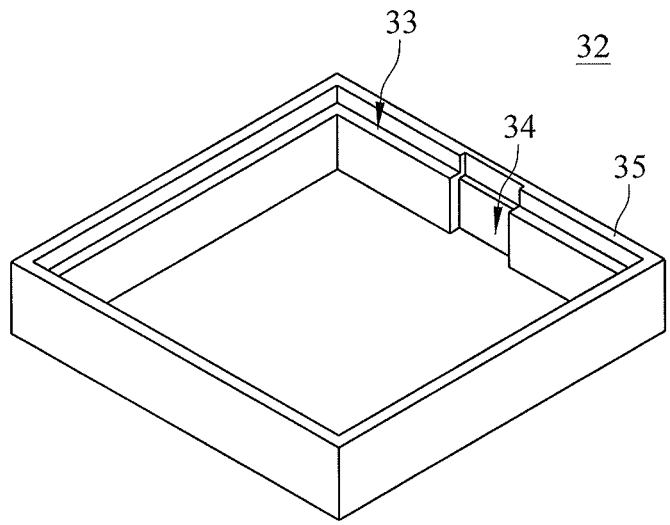
FIG. 6A is a perspective view of an intermediate layer according to an embodiment of the present invention.
Figure 6B:
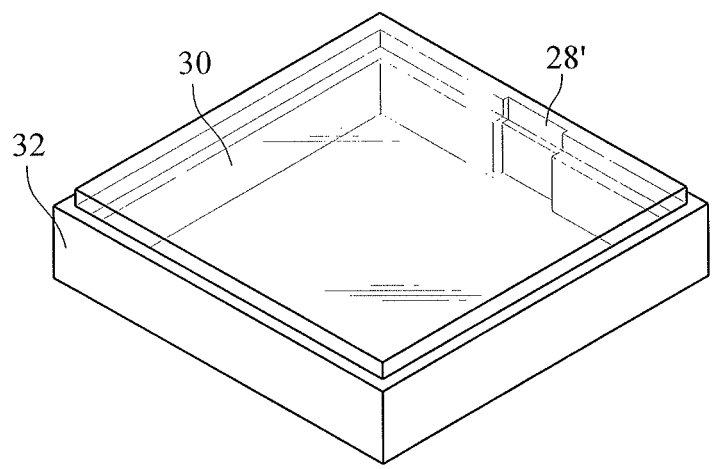
FIG. 6B is an assembled perspective view of an intermediate layer and a transparent plate according to an embodiment of the present invention.
Figure 6C:
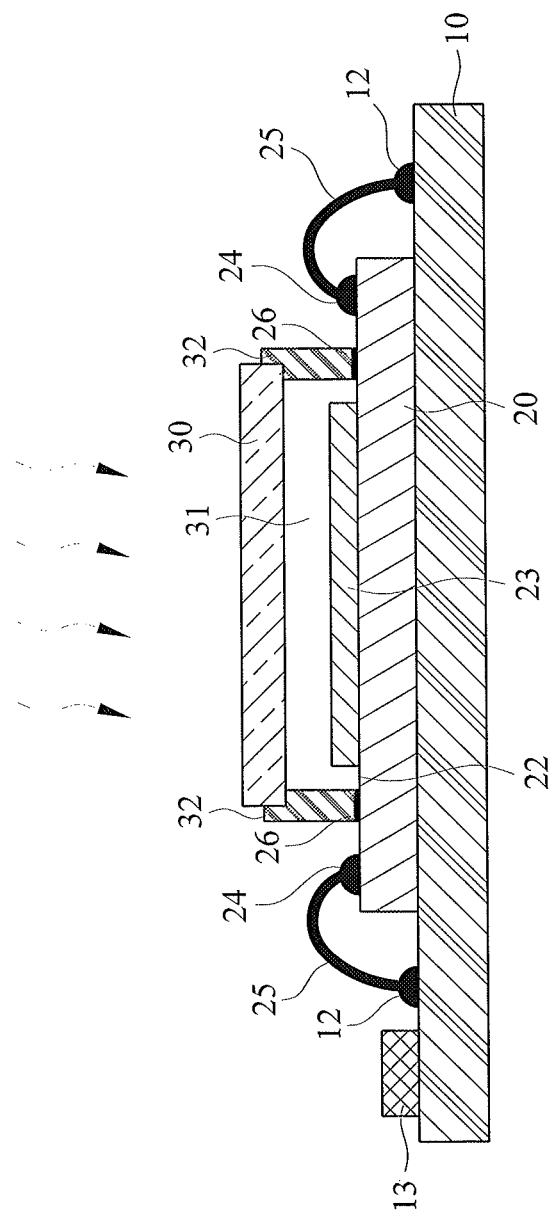
FIG. 6C is a schematic view of a semimanufacture of an image sensor obtained after an optical unit mounting process according to another embodiment of the present invention.
Figure 6D:
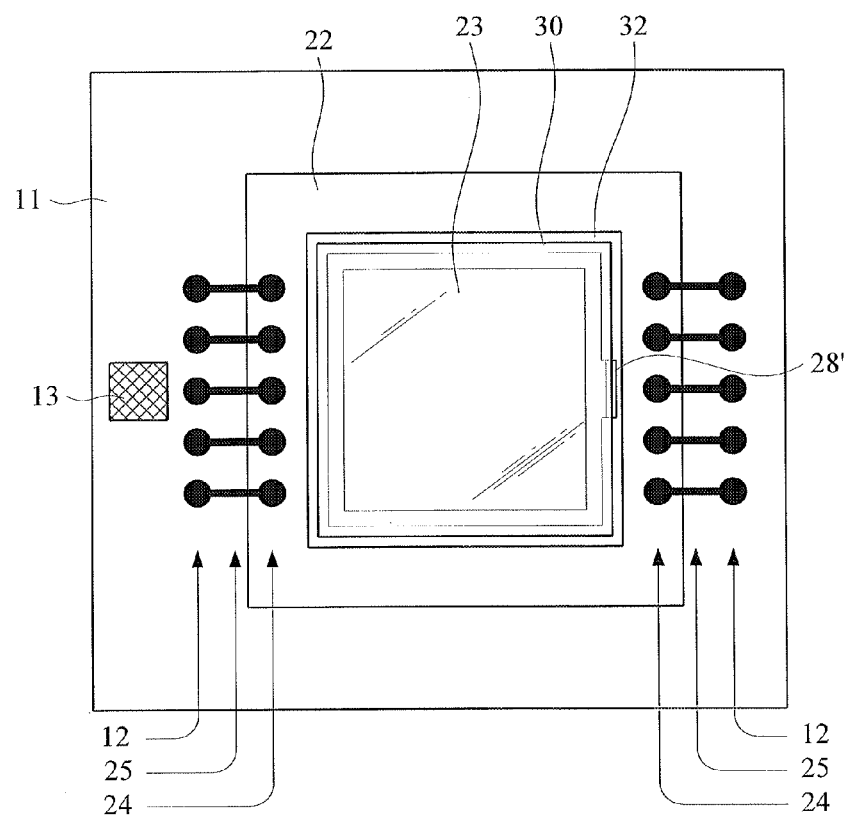
FIG. 6D is a top view of FIG. 6C.

Referring also to FIG. 6C and FIG. 6D, while the foregoing processes are designed to render the pressure in the air chamber 31 as close to the ambient pressure as possible to prevent unevenness of the optical unit, the inner side of the intermediate layer 32 may further have a recess 34 so that, when the transparent plate 30 is attached to the intermediate layer 32 (e.g., adhesively attached to the frame-shaped groove 33) in the optical unit mounting process (step S40), a gap 28' is formed outside the transparent plate 30 to prevent complete air-tightness. The gap 28' enables air circulation into and out of the air chamber 31 and ensures secure adhesion of the optical unit, which secure adhesion is difficult to achieve if the pressure in the air chamber 31 is greater than that outside the air chamber 31.

As shown in FIG. 2, the method S100 for reducing the tilt of an optical unit during manufacture of an image sensor further includes a gap sealing process (step S45). The gap sealing process (step S45) is carried out after the optical unit mounting process (step S40) by sealing the gap(s) 28/28' with a sealant so as to protect the photosensitive region 23 from influences of external factors.

Finally, a packaging process (step S50) is carried out by packaging the semimanufacture and the optical unit with an encapsulant 40 through use of a molding process or a dispensing technology.

Figure 7A:
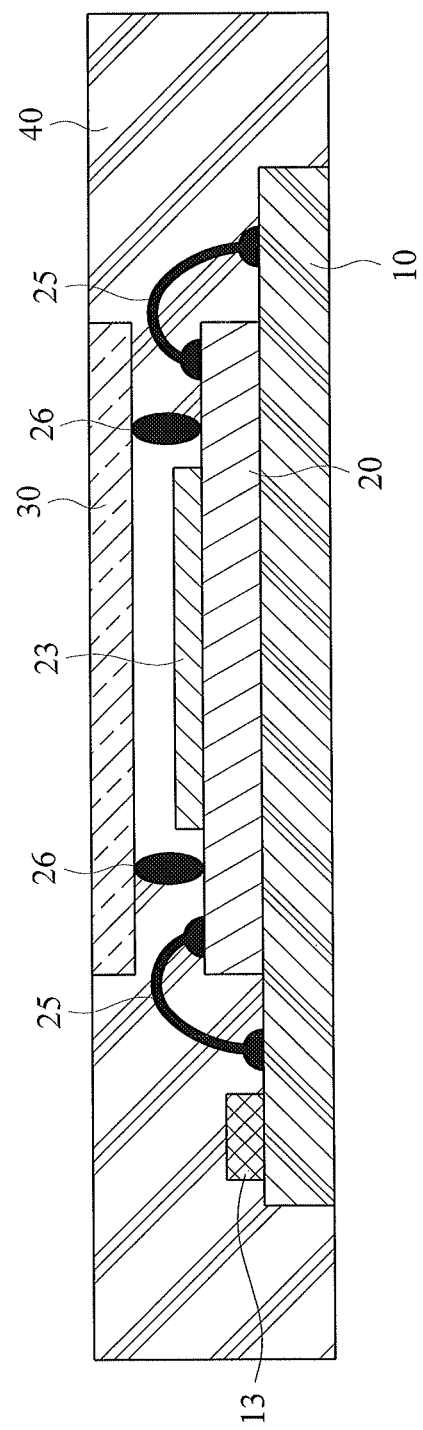
FIG. 7A illustrates the first aspect of an image sensor obtained after a packaging process according to an embodiment of the present invention.

As shown in FIG. 7A, the encapsulant 40 may be applied to cover side edges of the semimanufacture, the adhesive 26, and the optical unit (e.g., transparent plate 30). More specifically, a space formed by side edges of the optical unit and a bottom surface of the optical unit, side edges of the circuit substrate 10 and a top surface of the circuit substrate 10, and the periphery of the closed pattern region applied with the adhesive 26 may be encapsulated by the encapsulant 40. Thus, by using the encapsulant 40 to cover the side edges of the circuit substrate 10, the side edges of the circuit substrate 10 can be prevented from being damaged due to impacts.

Figure 7B:
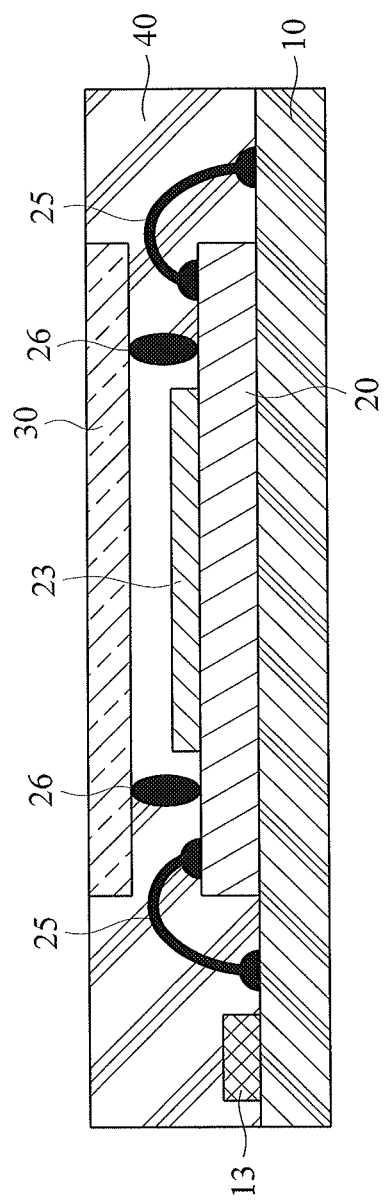
FIG. 7B illustrates the second aspect of an image sensor obtained after a packaging process according to an embodiment of the present invention.

Further, as shown in FIG. 7B, the encapsulant 40 may also be disposed on the circuit substrate 10 and cover the side edges of the image sensor die 20, the adhesive 26, and the optical unit (e.g., transparent plate 30). More specifically, a space formed by side edges of the transparent plate 30 and the bottom surface of the transparent plate 30, the top surface of the circuit substrate 10 (but except for the side edges of the circuit substrate 10) and the periphery of the closed pattern region applied with the adhesive 26 may be encapsulated by the encapsulant 40.

Figure 8A:
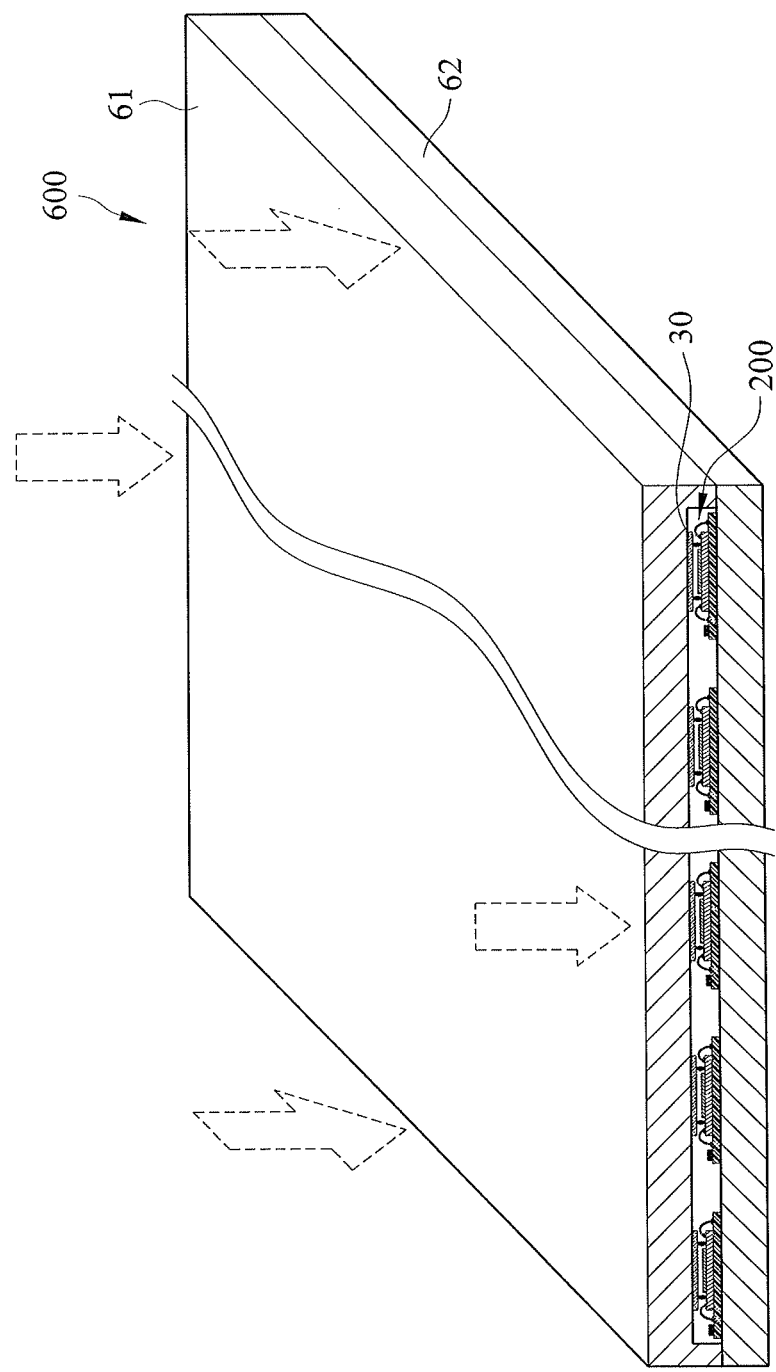
FIG. 8A is a cross-sectional view illustrating a large-scale packaging mold in combination with semimanufactures of image sensors according to an embodiment of the present invention.
Figure 8B:
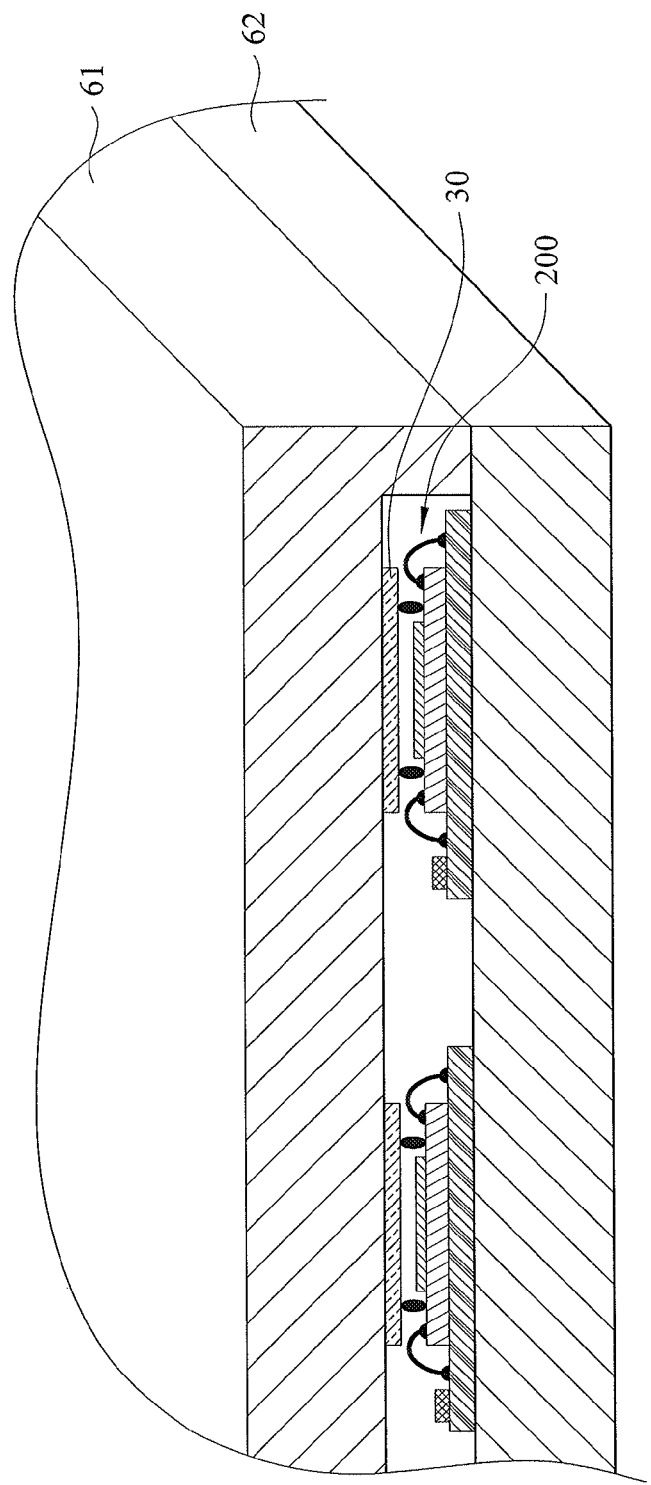
FIG. 8B is a partially enlarged view of FIG. 7A.

As shown in FIG. 8A and FIG. 8B, in this embodiment, semimanufactures 200 that have been subjected to the optical unit closing process (step S40) may also be arranged on a base 62 of a large-scale packaging mold 600, and then a top cover 61 of the large-scale packaging mold 600 is joined with the base 62 to carry out the packaging process (step S50) so as to achieve the purpose of mass production.

The features of the present invention are disclosed above by the preferred embodiment to allow persons skilled in the art to gain insight into the contents of the present invention and implement the present invention accordingly. The preferred embodiment of the present invention should not be interpreted as restrictive of the scope of the present invention. Hence, all equivalent modifications or amendments made to the aforesaid embodiment should fall within the scope of the appended claims.

What is claimed is:

1. A method for reducing the tilt of an optical unit during manufacturing of an image sensor, comprising the following steps:

providing a semimanufacture of the image sensor, which comprises a circuit substrate and an image sensor die, wherein the circuit substrate has a supporting surface and a bottom surface, a plurality of first conductive contacts are provided on the supporting surface, and the image sensor die comprises: a first surface attached to the supporting surface; a second surface having a photosensitive region; and a plurality of second conductive contacts disposed outside the photosensitive region and electrically connected to the first conductive contacts via metal wirings respectively;

carrying out a preheating process by placing the semi-manufacture into an environment at a specific temperature;

carrying out an adhesive application process by, after the preheating process, applying an adhesive onto the second surface around the photosensitive region without covering the photosensitive region;

carrying out an optical unit closing process by, after the adhesive application process, placing an optical unit on the adhesive and curing the adhesive to fix the optical unit onto the second surface and to form an air chamber between the image sensor die and the optical unit; and carrying out a packaging process by packaging the semi-manufacture and the optical unit with an encapsulant.

2. The method for reducing the tilt of an optical unit during manufacturing of an image sensor of claim 1, wherein the image sensor die is a complementary metal oxide semiconductor (CMOS) image sensor die or a charge coupled device (CCD).

3. The method for reducing the tilt of an optical unit during manufacturing of an image sensor of claim 1, wherein the specific temperature ranges between 35° C. and 45° C.

4. The method for reducing the tilt of an optical unit during manufacturing of an image sensor of claim 1, wherein an environmental temperature in the adhesive application process ranges between 35° C. and 45° C.

5. The method for reducing the tilt of an optical unit during manufacturing of an image sensor of claim 1, wherein in the adhesive application process, the adhesive is applied to an area between the photosensitive region and the second conductive contacts and forms a closed pattern.

6. The method for reducing the tilt of an optical unit during manufacturing of an image sensor of claim 1, wherein in the adhesive application process, the adhesive is applied to an area between the photosensitive region and the second conductive contacts and forms a generally C-shaped pattern, the generally C-shaped pattern having a gap.

7. The method for reducing the tilt of an optical unit during manufacturing of an image sensor of claim 1, wherein in the adhesive application process, the adhesive is applied to an area between the photosensitive region and the second conductive contacts and forms two L-shaped patterns, the L-shaped patterns facing each other in such a way that a hollow square pattern with two opposite corners each having a gap is formed.

8. The method for reducing the tilt of an optical unit during manufacturing of an image sensor of claim 1, wherein a plurality of ball spacers is further added in the adhesive.

9. The method for reducing the tilt of an optical unit during manufacturing of an image sensor of claim 1, wherein an environment temperature in the optical unit closing process ranges between 35° C. and 45° C.

10. The method for reducing the tilt of an optical unit during manufacturing of an image sensor of claim 1, wherein the optical unit is a transparent plate made of glass.

11. The method for reducing the tilt of an optical unit during manufacturing of an image sensor of claim 1, wherein the adhesive is a photocurable adhesive.

12. The method for reducing the tilt of an optical unit during manufacturing of an image sensor of claim 1, wherein the photocurable adhesive is an ultraviolet (UV) curable adhesive, and in the optical unit closing process, the UV curable adhesive is cured through irradiation of UV light rays.

13. The method for reducing the tilt of an optical unit during manufacturing of an image sensor of claim 1, wherein the encapsulant is applied to cover side edges of the semi-manufacture, the adhesive and the optical unit in the packaging process.

14. The method for reducing the tilt of a transparent plate during manufacturing of an image sensor of claim 1, wherein the encapsulant is disposed on the circuit substrate and covers the side edges of the image sensor die, the adhesive and the optical unit in the packaging process.

15. The method for reducing the tilt of an optical unit during manufacturing of an image sensor of claim 1, wherein the optical unit comprises an intermediate layer and a transparent plate, the intermediate layer having a hollow square structure and a frame-shaped groove formed on an inner side of an upper surface of the intermediate layer, the intermediate layer being aligned with and adhesively attached to the adhesive in the optical unit mounting process, the transparent plate being adhesively attached to the frame-shaped groove.

16. The method for reducing the tilt of an optical unit during manufacturing of an image sensor of claim 15, wherein the intermediate layer has a recess such that, once the transparent plate is attached to the intermediate layer, a gap is formed outside the transparent plate.

17. The method for reducing the tilt of an optical unit during manufacturing of an image sensor of claim 15, wherein the intermediate layer is made of glass, ceramic, a liquid crystal polymer, a molding compound, a siloxane-based polymer, a photosensitive dry film, or a solder mask.

18. The method for reducing the tilt of an optical unit during manufacturing of an image sensor of claim 6, further comprising a gap sealing process in which the gap or the gaps are sealed with a sealant after the optical unit mounting process.

19. The method for reducing the tilt of an optical unit during manufacturing of an image sensor of claim 7, further comprising a gap sealing process in which the gap or the gaps are sealed with a sealant after the optical unit mounting process.

20. The method for reducing the tilt of an optical unit during manufacturing of an image sensor of claim 16, further comprising a gap sealing process in which the gap or the gaps are sealed with a sealant after the optical unit mounting process.

* * * * *